(12) United States Patent
Lee

(10) Patent No.: US 7,655,573 B2
(45) Date of Patent: Feb. 2, 2010

(54) METHOD OF FORMING A MASK PATTERN

(75) Inventor: Sung Hoon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/751,734

(22) Filed: May 22, 2007

(65) Prior Publication Data

US 2008/0032506 A1     Feb. 7, 2008

(30) Foreign Application Priority Data

Aug. 2, 2006    (KR) ...................... 10-2006-0073041

(51) Int. Cl.
    *H01L 21/302*      (2006.01)
    *H01L 21/461*      (2006.01)

(52) U.S. Cl. ...................... 438/717; 438/725; 438/737; 438/740; 257/E21.038

(58) Field of Classification Search ................ 438/717, 438/725, 737, 740; 257/E21.038
See application file for complete search history.

(56) References Cited

U.S. PATENT DOCUMENTS

| | | | |
|---|---|---|---|
| 5,328,810 A * | 7/1994 | Lowrey et al. | 430/313 |
| 5,739,049 A * | 4/1998 | Park et al. | 438/3 |
| 5,795,830 A * | 8/1998 | Cronin et al. | 438/696 |
| 6,110,837 A * | 8/2000 | Linliu et al. | 438/723 |
| 6,239,008 B1 * | 5/2001 | Yu et al. | 438/587 |
| 6,622,373 B1 * | 9/2003 | Tu | 29/611 |
| 6,632,741 B1 * | 10/2003 | Clevenger et al. | 438/689 |
| 6,638,441 B2 * | 10/2003 | Chang et al. | 216/46 |
| 6,875,703 B1 * | 4/2005 | Furukawa et al. | 438/736 |
| 7,183,142 B2 * | 2/2007 | Anderson et al. | 438/142 |
| 7,183,205 B2 * | 2/2007 | Hong | 438/671 |
| 7,439,144 B2 * | 10/2008 | Doris et al. | 438/314 |
| 2006/0009025 A1 * | 1/2006 | Kanamura | 438/618 |
| 2006/0046201 A1 * | 3/2006 | Sandhu et al. | 430/314 |
| 2006/0046484 A1 * | 3/2006 | Abatchev et al. | 438/689 |
| 2006/0068596 A1 * | 3/2006 | Dobuzinsky et al. | 438/740 |
| 2006/0172540 A1 * | 8/2006 | Marks et al. | 438/700 |
| 2006/0249784 A1 * | 11/2006 | Black et al. | 257/327 |
| 2007/0026684 A1 * | 2/2007 | Parascandola et al. | 438/733 |
| 2007/0059891 A1 * | 3/2007 | Furukawa et al. | 438/299 |
| 2007/0059914 A1 * | 3/2007 | Jung et al. | 438/597 |
| 2007/0099431 A1 * | 5/2007 | Li | 438/735 |

(Continued)

FOREIGN PATENT DOCUMENTS

KR     10-2006-0000678     1/2006

*Primary Examiner*—George Fourson
*Assistant Examiner*—John M Parker
(74) *Attorney, Agent, or Firm*—Marshall, Gerstein & Borun LLP

(57) ABSTRACT

A method of forming a mask pattern and, more particularly, a method of forming a mask pattern wherein micro patterns having resolutions lower than those of exposure equipment by overcoming the resolutions of the exposure equipment, wherein, a silicon layer is formed over a substrate and is patterned. The patterned silicon layer is oxidized to form the entire surface of the silicon layer to a specific thickness by using an oxide layer. The oxide layer is removed to expose a top surface of the silicon layer. A mask pattern is formed with the remaining oxide layer by removing the silicon layer.

7 Claims, 2 Drawing Sheets

U.S. PATENT DOCUMENTS

2007/0190713 A1* 8/2007 Doris et al. .................. 438/199
2007/0264830 A1* 11/2007 Huang et al. ................. 438/694
2007/0285983 A1* 12/2007 Ishii et al. ............... 365/185.13
2008/0085600 A1* 4/2008 Furukawa et al. ........... 438/637
2008/0284021 A1* 11/2008 Anderson et al. ........... 257/751
2008/0286971 A1* 11/2008 Doris et al. ................. 438/694

* cited by examiner

METHOD OF FORMING A MASK PATTERN

CROSS-REFERENCE TO RELATED APPLICATION

The priority of Korean patent application number 10-2006-73041, filed on Aug. 2, 2006, which is incorporated by reference in its entirety, is claimed.

BACKGROUND OF THE INVENTION

The invention relates, in general, to a method of forming a mask pattern and, more particularly, to a method of forming a mask pattern wherein micro patterns having resolutions lower than those of exposure equipment can be formed by overcoming the resolutions of the exposure equipment.

As semiconductor products are miniaturized and highly-integrated, there is an increasing interest for patterning techniques for forming patterns in order to develop new functions of devices.

A patterning technique having a high level of integration has been developed as a core technique of semiconductor manufacturing, and largely employs a photolithography process.

The photolithography process includes forming a photoresist layer by coating a photoresist, that is, chemical material that reacts to radiation, performing exposure and development processes on the photoresist layer to form a mask pattern, and selectively etching a lower layer by using the formed mask pattern.

In general, the process capability limit (resolutions) of photoresist exposure equipment used for pattern formation is decided by a wavelength of a light source and numerical aperture (NA) of the exposure equipment as in the following Equation 1.

$$R = kS \frac{\lambda}{NA}$$

where, R is resolution, k is a process parameter, $\lambda$ is a wavelength of the light source, and NA is a numerical aperture.

The resolutions of exposure equipment that has been developed so far are 55 nm on the basis of a half pitch. Thus, there is a need for developing new and expensive exposure equipment in order to form a pattern requiring resolutions that exceed the process capability limit of the existing exposure equipment, that is, a pattern of 50 nm or less.

SUMMARY OF THE INVENTION

Accordingly, the invention addresses the foregoing problems, and provides a method of forming a mask pattern wherein micro patterns with resolutions lower than those of the existing photoresist exposure equipment can be formed by overcoming the resolutions of the exposure equipment without the investment of new exposure equipment.

According to an aspect, the invention provides a method of forming a mask pattern, including the steps of forming a silicon layer over a substrate, patterning the silicon layer, oxidizing the patterned silicon layer to form the entire surface of the silicon layer to a specific thickness by using an oxide layer, removing the oxide layer to expose a top surface of the silicon layer, and forming a mask pattern with the remaining oxide layer by removing the silicon layer.

DESCRIPTION OF SPECIFIC EMBODIMENTS

A specific embodiment according to the invention is described below with reference to the accompanying drawings.

Figure 1A:
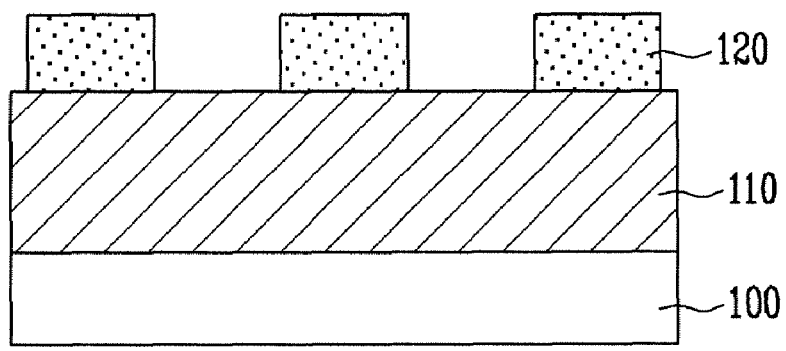
FIGS. 1A to 1E are cross-sectional view illustrating a method of forming a mask pattern according to an embodiment of the invention.

Referring to FIG. 1A, a layer to be patterned (not illustrated) is formed on a substrate 100. A silicon layer 110 is formed on the layer. The silicon layer 110 is preferably formed from amorphous silicon or polysilicon. The silicon layer 110 is preferably formed by a Chemical Vapor Deposition (CVD) method, preferably a Low Pressure CVD (LPCVD) method.

A photoresist pattern 120 is formed on the silicon layer 110. The photoresist pattern 120 is preferably formed by coating a photoresist (PR) on the silicon layer 110 to form a photoresist layer and exposing and developing the photoresist layer.

The photoresist pattern 120 is illustratively patterned in exposure equipment with resolutions of 50 nm to 200 nm.

Figure 1B:
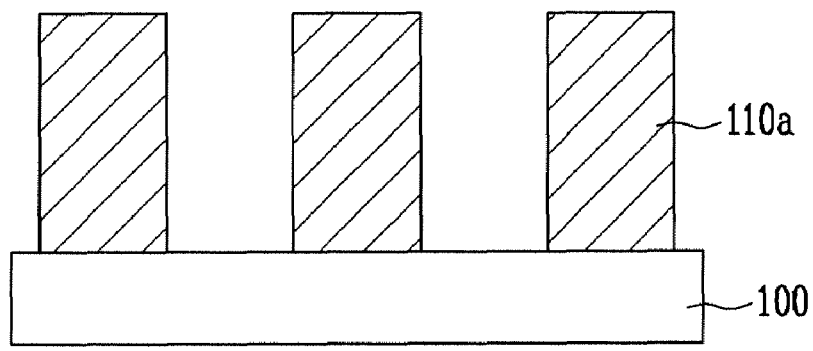

Referring to FIG. 1B, the silicon layer 110 is patterned using the photoresist patterns 120 as masks, forming silicon layer patterns 110a.

That is, the silicon layers 110 are illustratively patterned in exposure equipment with the resolutions of 50 nm to 200 nm.

The silicon layer 110 is patterned to the extent that a distance between oxide layers becomes a target distance by taking into consideration that the distance is narrowed as the oxide layers grow on the entire surface in a subsequent oxidization process.

Figure 1C:
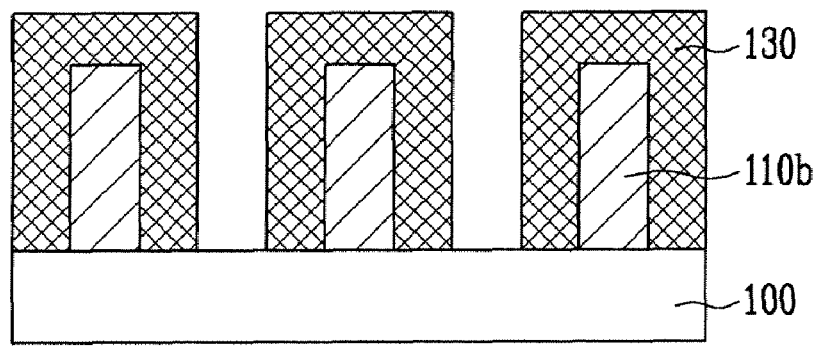

Referring to FIG. 1C, the silicon layer patterns 110a are oxidized so that the entire surface of each silicon layer pattern 110a results in an oxide layer 130 to a specific thickness.

In this case, the oxide layer 130 is grown inwardly and outwardly from the silicon layer pattern 110a to a specific thickness by means of the oxidization process. Thus, an oxidized silicon layer pattern 110b has a reduced height and width compared with the silicon layer pattern 110a. Further, a distance between the oxide layers 130 becomes narrower than that between the silicon layer pattern 110a before oxidization.

In particular, in view of a thermal oxidation process, the growth thickness of the oxide layer 130 and the oxidized thickness of the silicon layer pattern 110a become constant. The thickness of the oxide layer 130 formed on the sidewall of the silicon layer pattern 110a becomes the width of a pattern that will be formed actually. It is therefore possible to control an actual pattern width by controlling the thickness of the oxide layer 130. The distance of the oxide layer 130 and the width of the silicon layer pattern 110b that remains is a distance of a pattern that will be actually formed.

The oxide layer 130 is preferably formed by means of an oxidization process at a temperature of 650° C. to 750° C. so that the characteristics of the semiconductor device are not influenced by minimizing thermal budget of a lower layer.

Figure 1D:
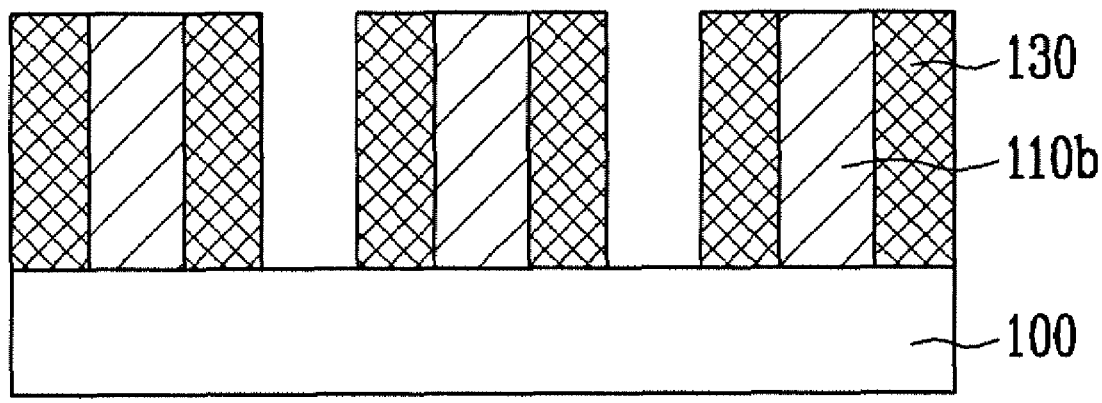

Referring to FIG. 1D, the oxide layer 130 is removed to expose the top surface of the oxidized silicon layer pattern 110b.

The process of removing the oxide layer 130 is preferably performed by a blanket etch process or a Chemical Mechanical Polishing (CMP) process.

Consequently, the oxide layer 130 remains only on both sides of the oxidized silicon layer pattern 110b.

Figure 1E:
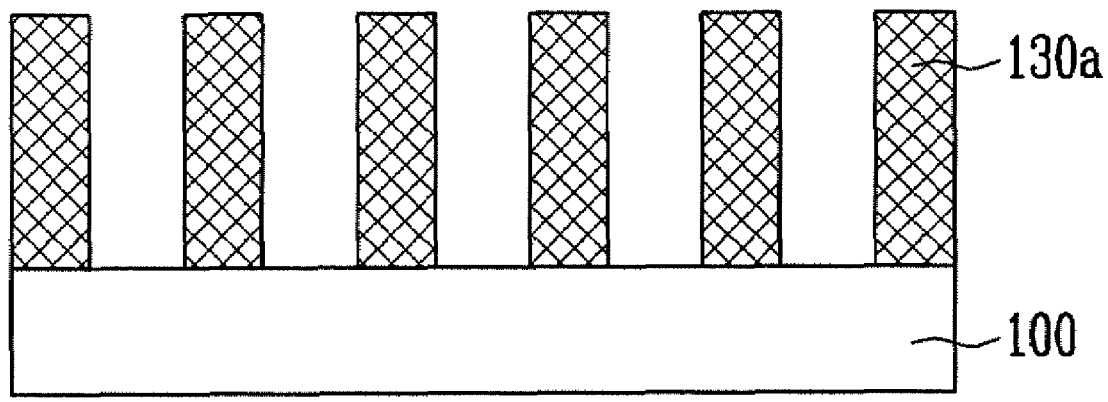

Referring to FIG. 1E, only the oxidized silicon layer patterns 110b are selectively removed to form mask patterns 130a with the remaining oxide layer 130.

The width of the mask pattern 130a is narrower than that of the silicon layer pattern 110a illustrated in FIG. 1B.

In other words, the mask pattern 130a illustratively having a half pitch of 20 nm to 50 nm can be formed through the oxide layer 130. The mask patterns 130a formed as described above are used as hard masks for forming actual patterns in a semiconductor device process.

As described above, according to the invention, a micro pattern with resolutions of 50 nm or less can be formed by employing the existing exposure equipment with the resolutions of 50 nm to 200 nm.

Furthermore, a micro pattern with resolutions of 50 nm or less can be formed without the investment of new exposure equipment by overcoming the resolutions of the existing exposure equipment. Accordingly the investment cost of exposure equipment can be saved.

In addition, a mask pattern having resolutions lower than those of the existing exposure equipment can be formed by using an oxide layer formed by an oxidization process of a patterned silicon layer. Accordingly, micro patterns.

Although the foregoing description has been made with reference to a specific embodiment, changes and modifications may be made by one of ordinary skill in the art without departing from the spirit and scope of the invention.

What is claimed is:

1. A method of forming a mask pattern, comprising:
   forming a silicon layer over a substrate;
   patterning the silicon layer to form silicon layer patterns having an exposed surface;
   oxidizing the exposed surface of the silicon layer patterns by a thermal oxidization process, thereby forming oxide layers to cover each silicon layer pattern, wherein the oxide layers are isolated from each other;
   removing the oxide layers formed over a top surface of the silicon layer patterns, leaving the sidewalls still covered with the oxide layers; and
   removing the silicon layer patterns to form mask patterns with the remaining oxide layers.

2. The method of claim 1, wherein the oxide layer has a half pitch of 20 nm to 50 nm.

3. The method of claim 1, wherein the mask pattern has a width narrower than that of the patterned silicon layer.

4. The method of claim 1, comprising patterning the silicon layer in exposure equipment having resolutions of 50 nm to 200 nm.

5. The method of claim 1, comprising forming the silicon layer from amorphous silicon or polysilicon.

6. The method of claim 1, comprising patterning the silicon layer to the extent that a distance between the oxide layers becomes a target distance by taking into consideration that the distance between the oxide layers is narrowed as the oxide layers grow.

7. The method of claim 1, comprising forming the oxide layers by the thermal oxidization process at a temperature of 650° C. to 750° C.

* * * * *